(12) United States Patent
Chiang

(10) Patent No.: US 6,228,776 B1
(45) Date of Patent: May 8, 2001

(54) ASHING PROCESS BY ADJUSTING ETCHING ENDPOINT AND ORDERLY STEPPED POSITIONING SILICON WAFER

(75) Inventor: Wen-Peng Chiang, Hsin-Chu (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/455,924

(22) Filed: Dec. 7, 1999

(30) Foreign Application Priority Data

Jun. 14, 1999 (TW) .................................................. 88109869

(51) Int. Cl.[7] .................................................. H01L 21/302
(52) U.S. Cl. .......................... 438/725; 438/727; 216/16; 156/345
(58) Field of Search ............................... 156/345; 216/16; 438/712, 714, 725, 727

(56) References Cited

U.S. PATENT DOCUMENTS

| | | | |
|---|---|---|---|
| 4,812,201 | * 3/1989 | Sakai et al. | 156/643 |
| 5,284,547 | * 2/1994 | Watanabe | 156/626 |
| 5,453,157 | * 9/1995 | Jeng | 156/659.11 |
| 5,947,053 | * 9/1999 | Burnham et al. | 116/208 |
| 5,968,374 | * 10/1999 | Bullock | 216/16 |

* cited by examiner

Primary Examiner—Robert Kunemund
Assistant Examiner—Kin-Chan Chen

(57) ABSTRACT

A method used in some step of processing for ashing a photoresist resin film of a semiconductor wafer is disclosed. Generally the present method will conclude the following steps. Firstly adjusting Etch-Module-Asher endpoint is carried out. Then placing the substrate coated with the resist film in a vacuum chamber will be achieved. The next step is that positing silicon wafer into asher through the vacuum chamber having a wafer holding-set plate, it is for closely receiving and orderly stepped ranking the wafer. Here, the silicon wafer is pushed to the chamber. Finally, the last process is that adjusting second Etch-Module-Asher Endpoint. Simultaneously ashing the resist film by an oxygen plasma is carried out while heating the substrate to remove the resist film, therefore photoresist is peeled up a first end of the silicon wafer and the silicon wafer is cleaned up and the other end of the silicon wafer.

14 Claims, 3 Drawing Sheets

ASHING PROCESS BY ADJUSTING ETCHING ENDPOINT AND ORDERLY STEPPED POSITIONING SILICON WAFER

BACKGROUND OF THE INVENTION

1. Field of the Invention

The present invention is relative to a method, used in a step of processing for ashing a photoresist resin film of a semiconductor wafer. The invention more particularly relates to a method for the removal of a photoresist resin film by ashing after carrying out photolithography, etching or ion implantation in a production process for a semiconductor device, such as LSI, VLSI and the like.

2. Description of the Prior Art

When the silicon wafer is carried to a processing device by means of a chamber or the like in a step of processing or measuring the silicon wafer, particularly the wafer is required to be posited and ranked in sequence on the basis of the asher defined as a flat formed under the silicon wafer. Nowadays, ashing by active oxygen plasma is carried out for ashing a photoresist resin film of a semiconductor wafer. A light/ozone asher includes a process chamber having a sample stage for supporting a sample processed with active oxygen generated by irradiating ozone with UV rays while not irradiating the sample with UV rays. In this ashing method, a photoresist resin film is oxidized by plasma-activated oxygen, decomposed and, in this way, removed from the semiconductor wafer.

For this reason, the asher is a machine for photoresist-removing in the semiconductor process. Normally whether accomplishment of the ashing process will be depended on the decision from Etch-Module-Asher Endpoint being accommodated variations, or just by the asher's running time. However, any sort of asher's running time is totally different to different each other process. Normally it will waste time and costing by the method of running time because of its difficulty in controlling and its taking a long time in controlling.

As well known, Etch-Module-Asher Endpoint will show the final decision of ashing process. The asher also will produce higher throughput by useful Etch Module Asher Endpoint mode. However, how to achieve accommodated variations of Etch-Module-Asher Endpoint or which accommodated variations of Etch-Module-Asher Endpoint being the better result will indeed concerned. Especially exact Dead-Time is the most important parameter to the ashing process. If the Dead-Time is too long or too short, the bad result will be unfortunately obtained.

From previous experiences, some sorts of disadvantages are obviously discovered the following:

1. The change of adjacent in Processing-Time is just only one, not changed again for the same Processing-Time.
2. Silicon wafer should be firstly pre-coated an outer photoresist layer, therefore it will waste too much pieces of wafer and too much photoresist.
3. It is necessary to abject Etch-Module-Asher Endpoint mode for other different Etch Module Asher Endpoint when changing different layer or substrate.

Inevitably, there is created order ranking in positing the wafer on the basis of the asher because of inertial of the silicon wafer and its unfeasible to accurately positing the wafer. In the conventional positing method, the stopping time is not predetermined and hence it is unfavourably impossible to arbitrarily posit the silicon wafer.

SUMMARY OF THE INVENTION

In accordance with the present invention, a method is substantially provided for orderly stepped positing silicon wafer in order to ash photoresist resin film of silicon wafer. Therefore, the present invention, plasma ashing method for removing a resist film on a coated substrate consists the following steps. Firstly adjusting Etch-Module-Asher endpoint is achieved, then placing the substrate coated with the resist film in a vacuum chamber is all carried out. Consequentially next step is positing silicon wafer into asher through chamber with a wafer holding-set plate for closely receiving and orderly stepped ranking the wafer. Also the silicon wafer is pushed to the chamber. Then the second Etch-Module-Asher endpoint will be adjusted. Simultaneously, the resist film by an oxygen plasma is ashed while heat the substrate to remove the resist film. The photoresist is peeled up a first end of the silicon wafer and the silicon wafer is cleaned up, as well as the other end of the silicon wafer.

Whole series of steps conclude firstly positing a plurality of silicon wafer in sequence. Usually it consists of six pieces of silicon wafer as a serial of wafer position-type. Sequentially, evacuating five pieces of silicon wafer from the above serial of wafer position-type is carried out. In this stage, one piece of silicon wafer could be fulfilled. Finally repeating the above both steps, positing a plurality of silicon wafer in sequence and evacuating a plurality of position of silicon wafer. The object of the invention is to provide an ashing method, in order to avoid damage to semiconductor components occurs during ashing of a photoresist resin film by active oxygen plasma. Also to avoid a long treatment time occurring in an ashing method using a low pressure mercury discharge.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Moreover, while the present invention is illustrated by a number of preferred embodiments directed to ashing method, it is not intended that these illustrations be a limitation on the scope or applicability of the present invention. Further, while the illustrative examples use insulated adjusting and ranking method, it should be recognized that the ranking method may be replaced with some other methods. Thus, it is not intended that the ashing method of the present invention be limited to the methods illustrated. These methods are included to demonstrate the utility and application of the present invention to presently preferred embodiments.

Figure 1:
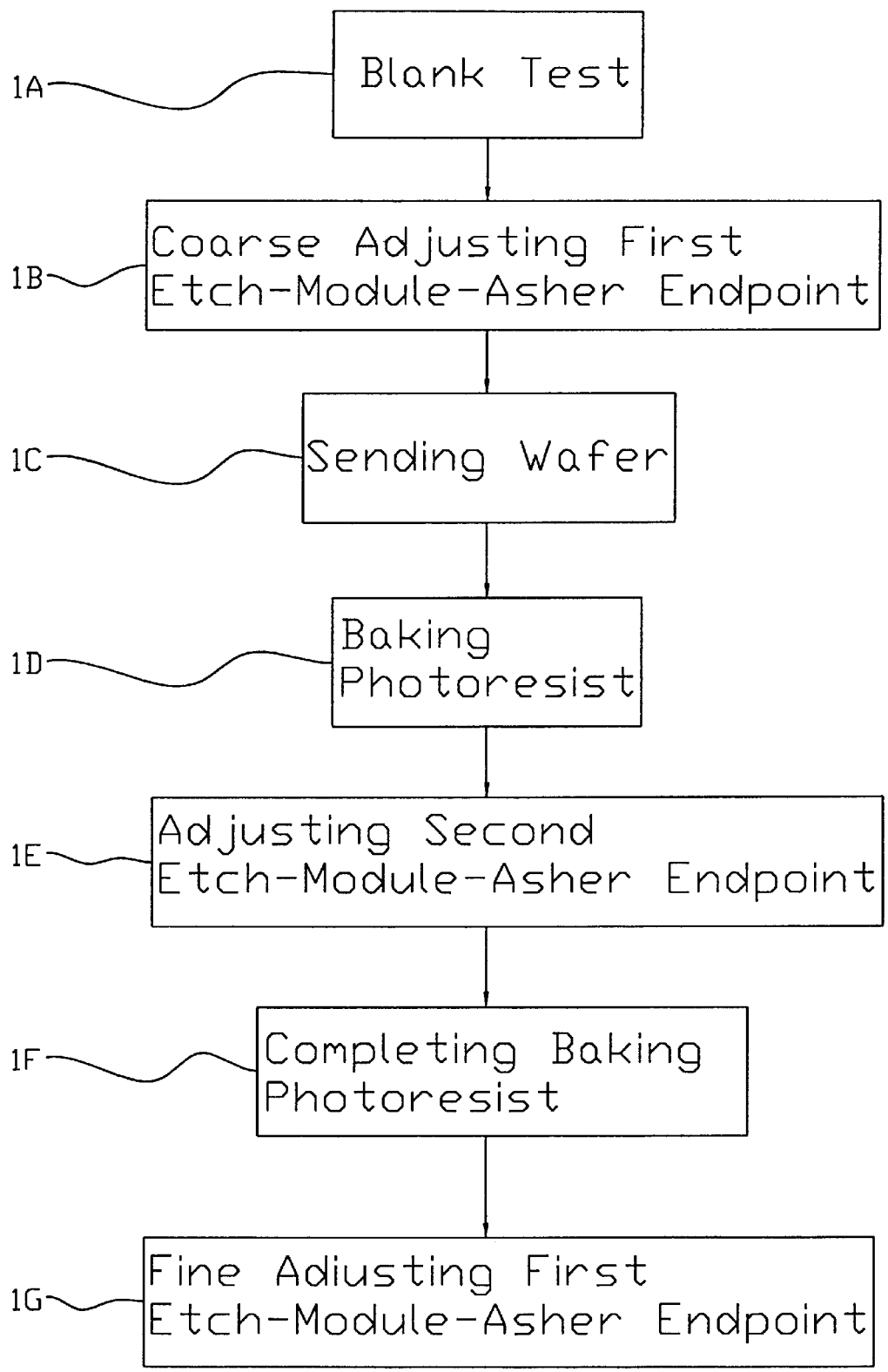
FIG. 1 is a diagrammatic representation showing an embodiment flow-chart of a photoresist resin film asher according to the invention.

FIG. 1 is a diagram illustrates as flow-chart of one embodiment. From flow-chart of processing, Etch-Module-Asher Endpoint is firstly accommodated variations named as Blank Test as step 1A. Blank Test normally will be carried out in the chamber of ashing apparatus. Meanwhile there is no more semiconductor wafer in the above chamber. At this stage, the signature is then coarse adjusted and obtained the first Etch-Module-Asher Endpoint as step 1B. Therefore from the controlling panel, Endpoint Display Value is certainly coarse adjusted and gained and its range is about between 200 to 250.

Figure 2:
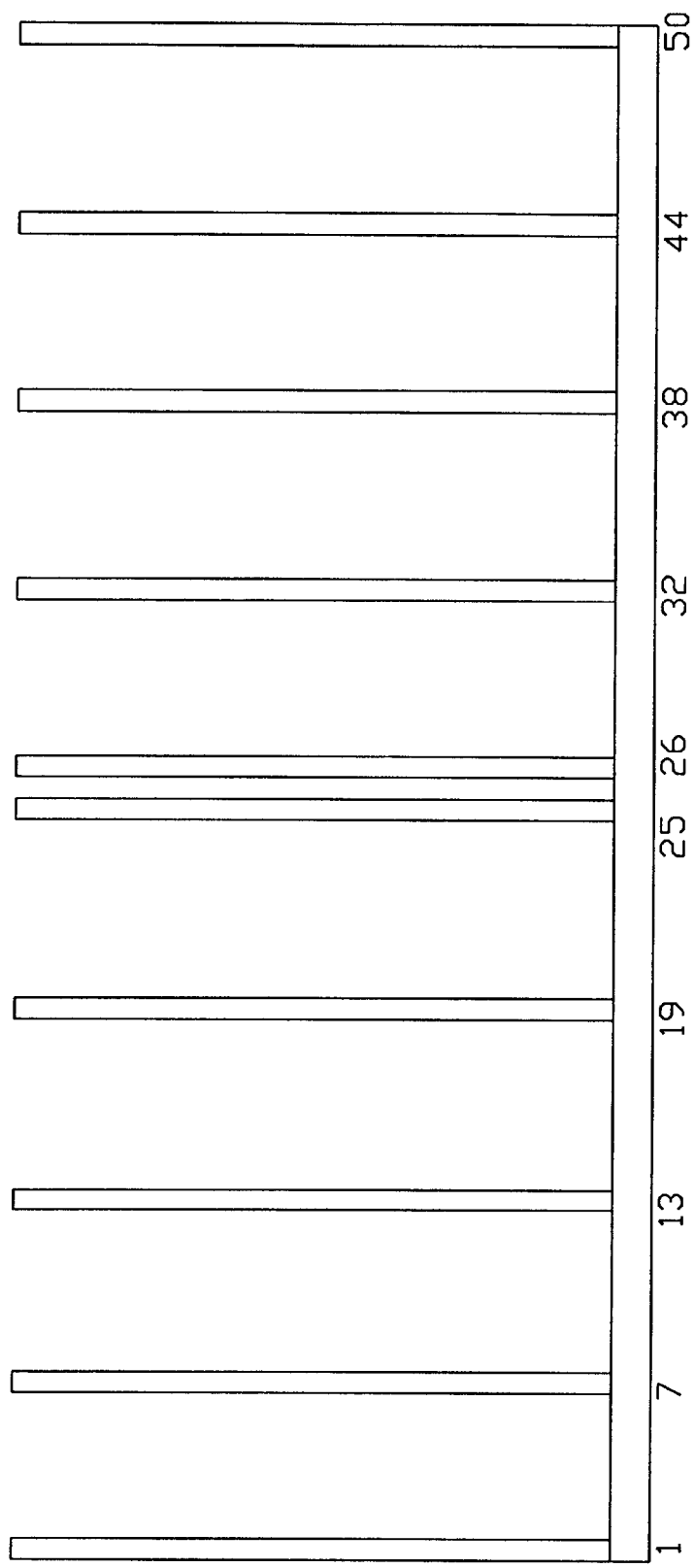
FIG. 2 is a diagram presenting an embodiment of positing wafer slide in sequence according to the invention.
Figure 3:
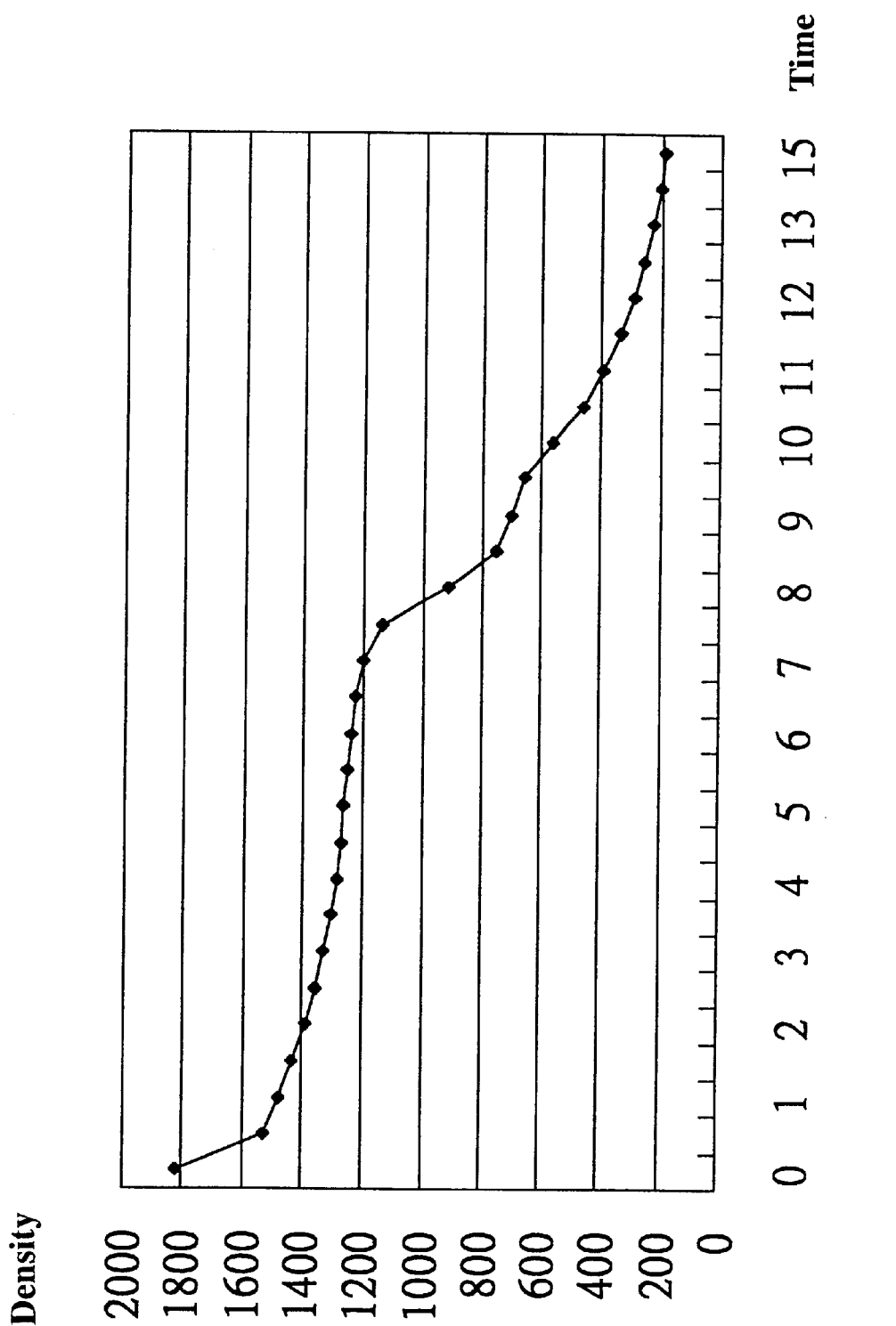
FIG. 3 is a diagram giving the test results obtained when ashing a photoresist resin film according to the invention.

The following step 1C is firstly positing unique piece of silicon resister wafer and then evacuating other five piece of silicon resister wafer as an empty position at wafer holding-set plate. Also the detailed diagram is shown as FIG. 2. Still referring FIG. 2 again, as a recycle, is repeated to posit unique piece silicon resister wafer and evacuate five piece of silicon resister wafer as an empty position for the following other silicon resister wafer. For example, number 1, 7, 13, 19, 25, 26, 32, 38, 44 and 50 all are the ranking number in sequence for positing silicon resister wafer. All the silicon wafer will be orderly stepped posited in a batch-type until all wafer holding-set are fulfilled, totally are about ten pieces of silicon wafer.

Sequentially as step 1D, photoresist is baked. Then as step 1D, adjusting second Etch-Module-Asher Endpoint process is achieved quickly. According to the above steps, the value of second Etch-Module-Asher Endpoint can be obtained from 1800 to 1900. Then, as well as backing photoresist is also completed, illustrated as step 1F. Finally fine adjusting the first Etch-Module-Asher Endpoint process, shown as step 1G is the final step for the invention. Thus, the whole value range for Module-Asher Endpoint will be achieved from 200 to 1900. This is the main setting value for this present invention.

One of the main features for this present invention is that, adjusting Etching-Module-Asher Endpoint. Especially Etching-Module-Asher Endpoint will be adjusted for three times respectively. Generally, the first setting time for coarse adjusting first Etching-Module-Asher Endpoint will be carried out after ashing blanket. The value of the first Module-Asher Endpoint can be around 200 to 250. However, the value of the first Module-Asher Endpoint can be observed even though the value is under 200.

Then, backing photoresist usually is employed after the above sending wafer. Thus, the second time for adjusting second Etching-Module-Asher Endpoint will be achieved after baking photoresist. The value of the second Module-Asher Endpoint can be distributed from 1800 to 1900 because the machine can show the highest value as 3500. Thus, while the second endpoint of product is higher than the endpoint of testing wafer, the degree in etching process also can be observed. The last time is for fine adjusting-first Etching-Module-Asher Endpoint after completing baking photoresist. In addition, the change of setting value for the first and second Module-Asher Endpoint are all depended on the different sorts of facilities and wafer materials.

Normally, silicon wafers normally are sent into the vacuum chamber of plasma apparatus using batch-type method. This batch-type method will be carried out by two hundreds or three hundreds even five hundreds pieces in an operation time. However, it would take thirty or fifty pieces of silicon wafer for obtaining Endpoint value according to the present invention. Therefore, the present invention will only take much fewer wafers and it will obtain quick and better result. The accommodated variations are fully achieved. Hence, according to this invention, the benefit will be performed much well than before. It costs less time and fewer silicon wafers exactly compared -with conventional method.

According to the above description, this method for ashing a photoresist resin film coated on a silicon semiconductor wafer will be employed by a plasma asher. It will conclude the following steps: firstly regulating a first Etch-Module-Asher Endpoint is carried out. Secondly the silicon semiconductor wafer coated with a photoresist resin film will be placed in a vacuum chamber. Then the silicon semiconductor wafer is positioned into asher through the vacuum chamber that owns a wafer holding-set plate through for closely receiving and orderly stepped ranking the wafer. The silicon semiconductor wafer will be pushed to the chamber and regulated as a second Etch-Module-Asher Endpoint.

Simultaneously the resist film will be ashed by an oxygen plasma while heating the substrate to remove the resist film. Thus, the photoresist is peeled up a first end of the silicon wafer. Also, the silicon semiconductor wafer is cleaned up and the other end of the silicon semiconductor wafer. Normally, here, the step for positioning the silicon wafer will conclude the following: a plurality of the silicon semiconductor wafers will be positioned in sequence. Then evacuating a plurality of positions of the silicon semiconductor wafers is carried out. Finally, positioning the plurality of the silicon semiconductor wafer in sequence and evacuating the plurality of positions of the silicon semiconductor wafer are repeated.

It will be mentioned that positing the plurality of the silicon semiconductor wafer will comprise about unique piece. Evacuating the plurality of the silicon semiconductor wafers could comprise about five pieces. Repeating positioning the plurality of the silicon semiconductor wafers in sequence and evacuating the plurality of positions of the silicon semiconductor wafer could comprise the vacuum chamber of asher which is full-filled.

Although specific embodiments have been illustrated and described, it will be obvious to those skilled in the art that various modifications may be made without departing from what is intended to be limited solely by the appended claims.

What is claimed is:

1. A method for adjusting Etch-Module-Asher Endpoint of plasma asher apparatus, comprising the steps of:
    regulating a first Etch-Module-Asher Endpoint;
    placing the semiconductor wafer coated with said resist film in a vacuum chamber;
    positioning the semiconductor wafer into asher through said vacuum chamber having a semiconductor wafer holding-set plate therethrough for closely receiving and orderly stepped ranking said semiconductor wafer therethrough, said semiconductor wafer being pushed to said vacuum chamber; and
    regulating a second Etch-Module-Asher Endpoint, whereby ashing the resist film by an oxygen plasma while heating the substrate to remove said resist film such that photoresist is peeled up a first end of said semiconductor wafer is cleaned up and the other end of said semiconductor wafer the same.

2. The method according to claim 1, wherein said regulating the second Etch-Module-Asher Endpoint further comprises starting wafer etching process.

3. The method according to claim 2, wherein said wafer etching process further comprises fine regulating said first Etch-Module-Asher Endpoint.

4. The method according to claim 1, wherein said semiconductor wafer comprises silicon semiconductor wafer.

5. The method according to claim 1, wherein said plasma asher comprises single light-zone asher and multiple light-zone plasma asher.

6. The method according to claim 1, wherein said positing semiconductor wafer comprising:

positioning a plurality of said semiconductor wafers in sequence;

evacuating a plurality of positions of said semiconductor wafer;

repeating said positioning said plurality of the semiconductor wafer in sequence and said evacuating the plurality of positions of said semiconductor wafer.

7. The method according to claim 6, wherein said positing said plurality of said semiconductor wafer comprises about unique piece.

8. The method according to claim 6, wherein said evacuating said plurality of said semiconductor wafers comprises about five pieces.

9. The method according to claim 6, wherein said repeating said positioning the plurality of said silicon wafers in sequence and said evacuating the plurality of positions of said silicon wafer comprises said chamber of said asher apparatus being full-filled.

10. A method for ashing a photoresist resin film coated on a silicon semiconductor wafer thereby using plasma asher apparatus, comprising the steps of:

regulating a first Etch-Module-Asher Endpoint;

placing the silicon semiconductor wafer coated with said photoresist resin film in a vacuum chamber;

positioning the silicon semiconductor wafer into asher through said vacuum chamber having a wafer holding-set plate therethrough for closely receiving and orderly stepped ranking said wafer therethrough, said silicon semiconductor wafer being pushed to said chamber; and regulating a second Etch-Module-Asher Endpoint, whereby simultaneously ashing the resist film by an oxygen plasma while heating the substrate to remove said resist film such that photoresist is peeled up a first end of said silicon wafer and said silicon semiconductor wafer is cleaned up and the other end of said silicon semiconductor wafer.

11. The method according to claim 10, wherein said positioning the silicon wafer comprising:

positioning a plurality of said silicon semiconductor wafers in sequence;

evacuating a plurality of positions of said silicon semiconductor wafers;

repeating said positioning said plurality of the silicon semiconductor wafer in sequence and said evacuating the plurality of positions of said silicon semiconductor wafer.

12. The method according to claim 11, wherein said positing said plurality of said silicon semiconductor wafer comprises about unique piece.

13. The method according to claim 11, wherein said evacuating said plurality of said silicon semiconductor wafers comprises about five pieces.

14. The method according to claim 11, wherein said repeating said positioning the plurality of said silicon semiconductor wafers in sequence and said evacuating the plurality of positions of said silicon semiconductor wafer comprises said vacuum chamber of asher apparatus being full-filled.

\* \* \* \* \*